(12) United States Patent
Tanaka et al.

(10) Patent No.: US 6,404,068 B1
(45) Date of Patent: Jun. 11, 2002

(54) PASTE COMPOSITION, AND PROTECTIVE FILM AND SEMICONDUCTOR DEVICE BOTH OBTAINED WITH THE SAME

(75) Inventors: Toshiaki Tanaka, Tsukuba; Takafumi Dohdoh; Tsutomu Kitakatsu, both of Ichihara; Aizou Kaneda, Yokohama; Masaaki Yasuda; Takashi Kousaka, both of Tsukuba; Akira Kageyama, Niiza, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/763,192

(22) PCT Filed: Aug. 20, 1999

(86) PCT No.: PCT/JP99/04473

§ 371 (c)(1),
(2), (4) Date: Feb. 20, 2001

(87) PCT Pub. No.: WO00/11084

PCT Pub. Date: Mar. 2, 2000

(30) Foreign Application Priority Data

Aug. 21, 1998 (JP) ............................................. 10-235097
Oct. 30, 1998 (JP) ............................................. 10-309776

(51) Int. Cl.⁷ ............................ H01L 23/48; H01L 23/52
(52) U.S. Cl. ........................ 257/787; 257/788; 257/793
(58) Field of Search .................................. 257/787, 788, 257/799, 793, 667; 43/123, 124, 112, 127

(56) References Cited

U.S. PATENT DOCUMENTS

| 4,933,744 A | | 6/1990 | Segawa et al. ............. 287/787 |
| 5,036,024 A | * | 7/1991 | Mine et al. ................. 257/787 |
| 5,294,835 A | * | 3/1994 | Igarashi et al. ............. 257/793 |
| 6,214,904 B1 | * | 4/2001 | Tanaka et al. .............. 438/780 |

FOREIGN PATENT DOCUMENTS

| EP | 0914027 | | 5/1999 | |
| JP | 3-35059 | * | 2/1991 | ................. 524/588 |
| JP | 5-132539 | | 5/1993 | |
| JP | 7-188615 | | 7/1995 | |
| JP | 7-330950 | * | 12/1995 | ........... H01L/23/29 |
| JP | 11-228787 | * | 8/1999 | ........... H01L/21/52 |

* cited by examiner

*Primary Examiner*—Jasmine J. B. Clark
(74) *Attorney, Agent, or Firm*—Antonelli, Terry, Stout & Kraus, LLP (57) ABSTRACT

A paste composition which comprises as essential ingredients (A) a thermoplastic resin, (B) an epoxy resin, (C) a coupling agent, (D) a powdery inorganic filler, (E) a powder having rubber elasticity and (F) an organic solvent and which, when applied and dried, gives a coating film having a void content of 3% by volume or higher and a water vapor permeability as measured at 40° C. and 90 %RH of 500 g/m²·24 h or less; a protective film which is formed by applying the paste composition to a surface of a semiconductor part and drying it and has a void content of 3% by volume or higher and a water vapor permeability as measured at 40° C. and 90%RH of 500 g/m²·24 h or less; and a semiconductor device having the protective film.

19 Claims, 1 Drawing Sheet

FIG. 1

PASTE COMPOSITION, AND PROTECTIVE FILM AND SEMICONDUCTOR DEVICE BOTH OBTAINED WITH THE SAME

TECHNICAL FIELD

The present invention relates to a paste composition using thermoplastic resins, and to a protective film and a semiconductor device both obtained with the same.

BACKGROUND ART

With recent progress in downsizing and thinning electric parts, the types of resin sealed packages have been changed from printed board-insertion types (such as DIP: Dual in-line Package) to surface mounting types, for example, Chip on Board (COB) and Flip Chip mounting both for mounting bare chips directly on boards, and further to QFP (Quad Flat Package) and BGA (Ball Grid Array). In these fields, not only conventional thermosetting epoxy resin liquid sealing materials but also thermoplastic resin liquid sealing materials have been developed and marketed. Such liquid sealing materials require high reliability because they directly seal IC or LSI chips. The spread of surface mounting has caused the requirement for high resistance to reflow, such as IR reflow, to ensure reliability of semiconductor elements. Upon mounting insertion-type packages on circuit boards, such as mother boards, only leads are locally heated. However, packages of surface mounting types are subjected to IR reflow, vapor phase reflow or solder dipping on mounting, so that they are wholly exposed to high temperatures of 200 to 250 ° C. Therefore, the water absorbed in the packages during storage evaporates and expands with heat on mounting, and when the generated stress exceeds the breaking strength of sealing resins, cracks run from the inside of the packages toward outside. Further troubles may arise, for example delamination between sealing resins and passivation films, such as silicon nitride films protecting semiconductor circuits, or disconnection of bonding wires, such as gold wires.

A common approach for improving reflow resistance through modification of sealing materials is to vary compositions of fillers or resins to give sealing materials which are less hygroscopic and reduce the moisture absorption of packages during storage, or have higher bonding strength to base materials or the like. It is, however, difficult for this approach to reconcile improved reflow resistance with good workability, and particularly, has failed to give liquid sealing materials having good reflow resistance. For example, the amount of fillers, such as silica, is increased to give less hygroscopic sealing materials. This can give sealing materials having lower linear expansion, decreasing damage to semiconductor elements. The filling rate can be increased to as much as 90% by weight or higher by optimizing the particle size distribution of silica filler, but the increased filling rates cause problems, such as molding failure due to increased viscosities.

Another means for improving reflow resistance is making through holes for exhausting the water evaporated in semiconductor packages during mounting with heat. For example, as to molding-type sealing materials, Japanese Patent Application Unexamined Publication No. 9-219471 (1997) proposes to drill through holes, and Japanese Patent Application Unexamined Publication No. 9-8179 (1997) proposes to selectively seal the reverse face of semiconductor elements with porous resins. These methods, however, sometimes allow water to enter adversely into semiconductor elements, and cannot ensure sufficient moisture resistance, which is no less important than reflow resistance. Another drawback to the method of selective sealing the back faces of semiconductor elements with porous resins is low productivity because the method needs a step of previously placing porous resin sheets in molds. Further, the method is hardly applicable to semiconductor packages which are difficult to seal by transfer molding using molds, such as cavity-type BGA and $\mu$ BGA.

Another known method is coating electric or electronic parts, such us Hybrid IC, with porous insulating paints (Japanese Patent Application Examined Publication No. 5-55197 (1993)), which, however, does not aim for improvement in reflow resistance but rather needs secondary moisture proof processing with impregnating materials, such as wax, to prevent the penetration of water.

DISCLOSURE OF INVENTION

This invention is made to solve the above-described problems, and an object of this invention is to provide a paste composition for sealing semiconductor having both good reflow resistance and moisture resistance reliability, a protective film using the same and a semiconductor device excelling in reflow resistance and moisture resistance reliability.

Upon various studies for solving the above-described problems, the inventors of this invention have found that semiconductor elements having both good reflow resistance and moisture resistance reliability can be obtained by preparing a paste composition wherein inorganic fillers are dispersed in a solution of resins dissolved in organic solvents, applying it to chips, such as IC or LSI, and drying. It seems to be the reason for this that, in the coating film of the cured resin composition, the voids remaining between the fillers and the fine voids through which evaporated organic solvents escaped remain inside the coating film, and a layer of low water vapor permeability densely filled with the resins is formed on the surface of the coating film.

This invention provides a paste composition, comprising as essential ingredients (A) a thermoplastic resin, (B) an epoxy resin, (C) a coupling agent, (D) a powdery inorganic filler, (E) a powder having rubber elasticity and (F) an organic solvent and which, when applied and dried, gives a coating film having a void content of 3% by volume or higher and a water vapor permeability as measured at 40° C. and 90%RH of 500 g/m$^2$·24 h or less.

In this invention, the thermoplastic resin (A) is preferably a polyamide-silicone copolymer or a polyamideimide-silicone copolymer, which is obtainable by polycondensing an aromatic dicarboxylic acid, an aromatic tricarboxylic acid or a reactive acid derivative thereof with a diamine containing as an essential ingredient a diaminosilicone.

In this invention, the epoxy resin (B) is preferably an alicyclic epoxy resin.

In this invention, the coupling agent (C) is preferably one or more coupling agents selected from a silane coupling agent, a titanate coupling agent and an aluminate coupling agent.

In this invention, the powder (E) having rubber elasticity is preferably silicon rubber powder.

This invention further provides a protective film which is formed by applying the paste composition to a surface of a semiconductor part and drying it and has a void content of 3% by volume or higher and a water vapor permeability as measured at 40° C. and 90%RH of 500 g/m$^2$·24 h or less.

This invention further provides a semiconductor device having the protective film.

In the semiconductor device of this invention, the protective film is preferably a sealing material sealing a chip in the semiconductor device.

In the semiconductor device of this invention, voids of 1 to 20 μm diameter in the sealing material preferably have a total volume of 1 to 100% by volume of a total volume of voids of 0.0032 to 100 μm diameter in the sealing material.

In the semiconductor device of the above-described embodiment, it is preferable that the chip is mounted on a chip-supporting board which comprises an inner connection part to which a terminal of the chip is connected, an outer connection part for connection with outside of the semiconductor device, and a interconnecting part connecting the inner connection part with the outer connection part. For example, it is preferable that the inner connection part is a interconnecting pattern formed on one side of an insulating base material, the outer connection part comprises a plurality of electrode parts formed on the other side of the insulating base material and connected to the interconnecting pattern by the interconnecting part, the chip is bonded to the side of the insulating base material bearing the interconnecting pattern by an adhesive for bonding semiconductor element, and the terminal of the chip and the interconnecting pattern are connected to each other by a gold wire.

BEST MODE FOR CARRYING THE INVENTION

Non-limitative examples of the thermoplastic resin (A) usable in this invention include acrylic resins, styrene resins, polyamide resins, polycarbonate resins, polyamideimide resins and polyetheramide resins. Among these preferred are thermoplastic resins obtainable by polycondensing an aromatic dicarboxylic acid, an aromatic tricarboxylic acid or a reactive acid derivative thereof with a diamine. Non-limitative but preferred examples of the diamine are aromatic diamines of the following general formula (I):

(I)

wherein $R_1$, $R_2$, $R_3$ and $R_4$ are each independently hydrogen, an alkyl group of 1 to 4 carbon atoms, an alkoxy group of 1 to 4 carbon atoms or a halogen atom, X is a single bond, wherein $R_5$ and $R_6$ are each independently a hydrogen, a lower alkyl group of 1 to 4 carbon atoms, trifluoromethyl group, trichloromethyl group or phenyl group.

In this invention, the thermoplastic resin (A) is preferably a polyamide-silicone copolymer or a polyamideimide-silicone copolymer, which is obtainable by polycondensing an aromatic dicarboxylic acid, an aromatic tricarboxylic acid or a reactive acid derivative thereof with a diamine containing as an essential ingredient a diaminosilicone. That is, preferred are polyamide-silicone copolymers or polyamideimide-silicone copolymers obtainable by the polycondensation of an aromatic dicarboxylic acid, an aromatic tricarboxylic acid or a reactive acid derivative thereof with a diamine wherein a diaminosilicone or both a diaminosilicone and other diamines, such as aromatic diamines, are used as the diamine.

Preferred diaminosilicones are those of the following general formula (II):

(II)

wherein $Y_1$ is a divalent hydrocarbon group, such as an alkylene group of 1 to 4 carbon atoms, a cycloalkylene group of 5 to 8 carbon atoms or an arylene group of 6 to 12 carbon atoms, $Y_2$ is a monovalent hydrocarbon group, such as an alkyl group of 1 to 4 carbon atoms, a cycloalkyl group of 5 to 8 carbon atoms or an aryl group of 6 to 12 carbon atoms, the two $Y_1$ groups are identical with or different from each other, the plural $Y_2$ groups are identical with or different from each other, and m is an integer of 1 or more, preferably an integer of 1 to 50.

Aromatic dicarboxylic acids have two carboxyl groups on an aromatic ring, and aromatic tricarboxylic acids have three carboxyl groups on an aromatic ring, and two of the three carboxyl groups are bonded to adjacent carbon atoms. Of course, the aromatic ring may contain heteroatoms, and two or more aromatic rings may be linked through alkylene groups, oxygen or carbonyl groups. Further, the aromatic ring may have substituents which do not take part in condensation, such as alkoxy groups, allyloxy groups, alkylamino groups or halogens.

Examples of the aromatic dicarboxylic acid include terephthalic acid, isophthalic acid, diphenyl ether dicarboxylic acid-4,4', diphenyl sulfone dicarboxylic acid-4,4', diphenyl dicarboxylic acid-4,4' and naphthalene dicarboxylic acid-1,5, with terephthalic acid and isophthalic acid preferred. Using a mixture of terephthalic acid and isophthalic acid is particularly preferable in view of the solubility of the resulting polymer. Examples of the reactive acid derivative of an aromatic dicarboxylic acid include dihalides, such as dichlorides or dibromides, or diesters of aromatic dicarboxylic acids.

Examples of the aromatic tricarboxylic acid include trimellitic acid, 3,3,4'-benzophenone tricarboxylic acid, 2,3,4'-diphenyl tricarboxylic acid, 2,3,6-pyridine tricarboxylic acid, 3,4,4'-benzanilide tricarboxylic acid, 1,4,5-naphthalene tricarboxylic acid and 2'-chlorobenzanilide-3, 4,4'-tricarboxylic acid. Examples of the reactive acid derivative of an aromatic tricarboxylic acid include acid anhydrides, halides, esters, amides and ammonium salts of aromatic tricarboxylic acids. Typical examples include trimellitic anhydride, trimellitic anhydride monochloride, 1,4-dicarboxy-3-N,N-dimethylcarbamoylbenzene, 1,4-dicarbomethoxy-3-carboxybenzene, 1,4-dicarboxy-3-carbophenoxybenzene, 2,6-dicarboxy-3- carbomethoxypyridine, 1,6-dicarboxy-5-carbamoylnaphthalene, and ammonium salts, such as those derived from the above-exemplified aromatic tricarboxylic acids and ammonia, dimethylamine or triethylamine. Among these, preferred are trimellitic anhydride and trimellitic anhydride monochloride.

(a) Examples of the aromatic diamines of general formula (I) having ether bonds include 2,2-bis[4-(4-aminophenoxy)phenyl]propane, 2,2-bis[3-methyl-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3,3-hexafluoro-2,2-bis[3-methyl-4-(4-aminophenoxy)phenyl]propane, 1,1-bis[4-(4-aminophenoxy)phenyl]cyclohexane, 1,1-bis[4-(4-aminophenoxy)phenyl]cyclopentane, bis[4-(4-aminophenoxy)phenyl] sulfone, bis[4-(4-aminophenoxy)phenyl] ether, 4,4'-carbonylbis(p-phenylenoxy)dianiline and 4,4'-bis(4-aminophenoxy)biphenyl. Among these, preferred is 2,2-bis[4-(4-aminophenoxy)phenyl]propane.

(b) Examples of aromatic diamines other than the above-described (a) include bis[4-(3-amonophenoxy)phenyl] sulfone, 1,3-bis(3-aminophenoxy)benzene, 1,3-bis(4-aminophenoxy)benzene, 1,4-bis(4-aminophenoxy)benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, 4,4'-diaminodiphenyl ether, 4,4'-diaminodiphenylmethane, 4,4'-diamino-3,3',5,5'-tetramethyldiphenyl ether, 4,4'-diamino-3,3',5,5'-tetramethyldiphenylmethane, 4,4'-diamino-3,3',5,5'-tetraethyldiphenyl ether, 2,2-[4,4'-diamino-3,3',5,5'-tetramethyldiphenyl]propane, metaphenylenediamine, paraphenylenediamine and 3,3'-diaminodiphenyl sulfone.

(c) Examples of diamines other than the above described aromatic diamines (a) and (b) and the diaminosilicones of the general formula (II) include aliphatic diamines, such as piperadine, hexamethylenediamine, heptamethylenediamine, tetramethylenediamine, p-xylylenediamine, m-xylylenediamine and 3-methylheptamethylenediamine.

These diamines may be used individually or in combination of two or more.

In cases where a thermoplastic resin obtainable by polycondensation of the above-described aromatic dicarboxylic acid, the aromatic tricarboxylic acids or the reactive acid derivative thereof with the diamine is used, the resin is preferably prepared by polycondensation using 0.8 to 1.2 moles, more preferably 0.95 to 1.05 moles of the aromatic dicarboxylic acid, the aromatic tricarboxylic acid or the reactive acid derivative thereof per mole of the total amount of the diamine. Using the aromatic dicarboxylic acid, the aromatic tricarboxylic acid or the reactive acid derivative thereof in amounts equimolar with the total of the diamine is preferable because it gives resins of the highest molecular weights. Either less than 0.8 moles or more than 1.2 moles of the aromatic dicarboxylic acid, the aromatic tricarboxylic acid or the reactive acid derivative thereof per mole of the diamine may give resins of lower molecular weights, lowering the mechanical strength and heat resistance of coating film.

The epoxy resin (B) to be used in this invention preferably has 2 or more epoxy groups per molecule. Particularly preferred epoxy resins (B) are aliphatic epoxy resins of the following general formula (III) or (IV), which advantageously improve adhesion strength;

wherein R is a trivalent organic group, and s, t and u are each an integer of 1 to 100;

wherein R' is a monovalent organic group and n is an integer of 1 to 100.

The epoxy resins may be used individually or in combination of two or more.

The content of the epoxy resin (B) added in the paste compositions of this invention is preferably 5 to 150 parts by weight, more preferably 10 to 100 parts by weight, further preferably 15 to 50 parts by weight relative to 100 parts by weight of the thermoplastic resin (A). Addition of less than 5 parts by weight of the epoxy resin (B) may aggravate adhesive property, and that of more than 150 parts by weight may cause considerable cure shrinkage on drying, increase elastic modulus and aggravate moisture resistance due to increased hygroscopicity. The paste compositions of this invention may optionally contain proper amounts of one or more curing agents for the epoxy resin (B), such as amines, acid anhydrides or other curing agents. Examples of amine curing agents include aliphatic amines, such as diethylenetriamine and triethylenetetramine, alicyclic polyamines, such as menthenediamines and isophoronediamines, aromatic primary amines, such as metaphenylenediamine and 4,4'-diaminodiphenylmethane and resin adducts thereof. Examples of acid anhydride curing agents include alicyclic acid anhydrides, such as methyltetrahydrophthalic anhydride, methylhexahydrophthalic anhydride and methylhaimic anhydride, aromatic acid anhydrides, such as dodecenylsuccinic anhydride and polyazelaic anhydride, and halogenated acid anhydrides, such as HET anhydride and tetrabromophthalic anhydride. Examples of other curing agents include tertiary amines, imidazoles, polyaminoamides, dicyanediamide, organic acid dihydrazides, phenolic resins, isocyanate compounds, Lewis acids and Bronsted acids. Latent curing agents derived from these curing agents may also be used.

The amount of the curing agent (G), if used, is preferably 1 to 100 parts by weight, more preferably 5 to 90 parts by weight relative to 100 parts by weight of the epoxy resin (B).

Examples of the coupling agent (C) usable in the present invention include silane coupling agents, such as γ-glycidoxypropyltrimethoxysilane, N-β(aminoethyl)-γ-aminopropyltrimethoxysilane, γ-aminopropyltrimethoxysilane and γ-glycidoxypropyltrimethoxysilane, titanate coupling agents, such as isopropyl triisostearoyl titanate, isopropyl trioctanoyl titanate, isopropyl tris (dioctylpyrophosphate) titanate, isopropyl tricumylphenyl titanate and tetraoctyl bis(ditridecylphosphite) titanate, and aluminate coupling agents, such as acetoalkoxyaluminum diisopropylate and aluminum acetylacetonate, and may be used individually or in combination of two or more. Among these, preferred are aluminate coupling agents.

The amount of the coupling agent (C) in the paste compositions of this invention is preferably 0.1 to 30 parts by weight, more preferably 0.3 to 5 parts by weight relative to 100 parts by weight of the thermoplastic resin (A). With less than 0.1 parts by weight of the coupling agent, improvement in adhesiveness and decrease in viscosity may be insufficient, and more than 30 parts by weight of it may increase the viscosity of the paste composition or deteriorate the properties of cured products.

Non-limitative examples of the powdery inorganic filler (D) usable in this invention include silicon dioxide powder, boron nitride powder, titanium dioxide powder, zirconium dioxide powder and alumina powder. In general, silicon dioxide powder is preferred. Using silicon dioxide powder together with titanium dioxide powder, zirconium dioxide powder or alumina powder can increase the heat conductivity of coating film.

The powdery inorganic filler (D) in the paste compositions of this invention preferably has an average particle diameter of 0.1 to 40 μm. Powdery inorganic fillers of less than 0.1 μm in average particle diameter may give low filling rates due to large surface areas, and those of more than 40 μm may be subject to sedimentation, giving paste compositions which are inferior in time-elapsing stability. Two or more kinds of powdery inorganic fillers of different average particle diameters may also be used in combination. To control the wetting spreadability of the paste compositions of this invention, not more than 10% by weight of powdery inorganic fillers of less than 0.1 μm in average particle diameter may be added based on the total amount of the paste compositions.

Powdery inorganic fillers (D) of a spherical shape, a crushed shape or other shapes may be used individually or in combination in consideration of workability, such as wetting spreadability and properties.

The content of the powdery inorganic filler (D) in the paste compositions of this invention is preferably 100 to 3500 parts by weight, more preferably 200 to 3000 parts by weight, further preferably 600 to 1200 parts by weight, particularly preferably 800 to 1200 parts by weight relative to 100 parts by weight of the thermoplastic resin (A). If the content of the powdery inorganic filler (D) is less than 100 parts by weight, it may be difficult to form thick film due to low thixotropy, and if it is more than 3500 parts by weight, coating film may be poor in strength and moisture resistance.

Examples of the powder (E) having rubber elasticity to be used in this invention include powders of urethane rubber, acrylic rubber, silicone rubber and butadiene rubber, with silicone rubber powder preferred. The powder (E) having rubber elasticity preferably has an average particle diameter of 0.1 to 20 μm, and preferably comprises spherical fine particles. If the powder (E) having rubber elasticity is less than 0.1 μm in average particle diameter, the time-elapsing stability of the paste compositions may be lowered due to insufficient dispersion, and if it is more than 20 μm, the coating film may have an uneven surface and low strength.

The content of the powder (E) having rubber elasticity in the paste compositions of this invention is preferably 20 to 300 parts by weight, more preferably 60 to 120 parts by weight, further preferably 80 to 120 parts by weight relative to 100 parts by weight of the thermoplastic resin (A). If the content of the powder (E) having rubber elasticity is less than 20 parts by weight, cured products may be cracked due to loss of low elasticity, and if it is more than 300 parts by weight, the strength of cured products may be lowered.

Examples of the organic solvent (F) to be used in this invention include ether compounds, such as tetrahydrofuran, dioxane, 1,2-dimethoxyethane, diethyleneglycol monoethyl ether, diethyleneglycol dimethyl ether and triethyleneglycol dimethyl ether, and alicyclic ketone compounds, such as cyclopentanone, cyclohexanone and 4-methyl-2-cyclohexanone. On preparation of the paste compositions of this invention, the powdery inorganic filler (D) and the powder (E) having rubber elasticity are mixed with the organic solvent (F).

The content of the organic solvent (F) in the paste compositions of this invention is preferably 150 to 3500 parts by weight, more preferably 150 to 1000 parts by weight, further preferably 200 to 1000 parts by weight, further preferably 300 to 600 parts by weight relative to 100 parts by weight of the thermoplastic resin (A). If the content of the organic solvent is less than 150 parts by weight, the high contents of solids may aggravate coatability, making it difficult to form coated layers of uniform thickness. If it is more than 3500 parts by weight, the insoluble components tend to settle without dispersing due to low viscosity, and the paste may lose time-elapsing stability, failing to form thick coating films.

When the paste compositions of this invention are prepared, colorants may be added, for example, carbon black, organic dyes, organic pigments or inorganic pigments.

The paste compositions of the preferred embodiments according to this invention may be prepared, for example, by dissolving, as the thermoplastic resin (A), 100 parts by weight of a polyamide resin obtained by polycondensing an aromatic dicarboxylic acid or a reactive acid derivative thereof with a diamine, 5 to 150 parts by weight of the epoxy resin (B), the optional curing agent (G) for the epoxy resin (B) in an amount of 1 to 100 parts by weight relative to 100 parts by weight of the epoxy resin (B), and 0.1 to 30 parts by weight of the coupling agent (C) in 100 to 3500 parts by weight of the organic solvent (F) to form a polymer varnish, and then adding thereto 100 to 3500 parts by weight of the powdery inorganic filler (D) and 10 to 700 parts by weight of the powder (E) having rubber elasticity, and mixing and kneading them with a kneader, three rolls, ball mills or the like.

Protective film can be formed by applying the paste compositions of this invention to the surfaces of semiconductor parts or the like and then drying. That is, the paste compositions of this invention can be readily formed into coating film by merely applying it and then drying by removing organic solvents with heat. The epoxy rein (B) is cured during the drying with heat, but the scale of the curing reaction is very small as compared with that of common epoxy resin-type sealing materials.

When coating film is formed by applying and drying the paste compositions of this invention, the inside of the coating film is a layer, which contains voids remaining between the powder of the powdery inorganic filler (D) without being filled with resins and fine voids formed and left by the evaporated solvents, while the surface of the coating film (the surface of the coating film that is in contact with the outside air and the coated parts, such as chips or chip-supporting boards) is a layer containing less or no voids and filled more densely with resin components as compared with the inside of the coating film. Particularly, the Al terminals of chips are coated and bonded with the resin components by the presence of the latter layer, ensuring the moisture resistant reliability of packages. While endowed with moisture resistance and strength by the surface layer, the coating film is improved, as compared with materials filled densely with resins and fillers, in reflow resistance because the fine voids remaining inside effectively relieve and diffuse the gases, such as evaporated water, which generate on reflow in the coating film. The boundary between the denser surface layer of low water-vapor permeability and the layer containing fine voids may be a clear one or a gradually changing one.

The paste compositions of this invention should contain as essential components the above described (A), (B), (C), (D), (E) and (F), and when applied and dried, should give a coating film having a void content of 3% by volume or higher and a water vapor permeability as measured at 40° C. and 90%RH (Relative Humidity) of 500 g/m$^2$·24 h or less. The void content in the coating film is preferably 3 to 30% by volume, more preferably 5 to 30% by volume, further preferably 5 to 20% by volume of the whole coating film. Void contents of less than 3% by volume are not enough for sufficient relief and diffusion of gases, resulting in poor reflow resistance. The water vapor permeability of the coating film is preferably 30 to 500 g/m$^2$·24 h. If the water vapor permeability is more than 500 g/m$^2$·24 h, the absorption of water from the outside will increase, lowering the moisture resistance reliability of the coating film and the moisture resistance of semiconductor elements. If the water vapor permeability of the coating film is less than 30 g/m$^2$·24 h, the coating film may have improved moisture resistance reliability, but may be subject to cracking at the time of mounting with heat due to the lack of the path for exhausting and relieving the evaporated water that had been absorbed therein.

Using the coating films having void contents and water vapor permeability both adjusted to the above-described proper ranges as protective films for semiconductor parts gives semiconductor devices which are excellent in reflow resistance and moisture resistance. To adjust the void content and the water vapor permeability of the coating film within the above described range, the ratio of the resin components consisting of the thermoplastic resin (A) and the epoxy resin (B), (A)+(B), to the filler components consisting of the powdery inorganic filler (D) and the powder (E) having rubber elasticity, (D)+(E), namely the [(A)+(B)]:[(D)+(E)] weight ratio is preferably 5:95–18:82, more preferably 6:94–15:85. For example, in cases where a paste composition containing a mixture of polyamide-silicone copolymer:alicyclic epoxy resin of 8:2 (weight ratio) as resin components, a mixture of silicon dioxide powder:silicone rubber powder of 9:1 (weight ratio) as filler components and diethyleneglycol dimethyl ether as the organic solvent is used to form dry (cured) coating films of 100 to 1000 μm thick by step drying of 70° C./120° C./160° C., coating films having a void content of 3% by volume or higher and a water vapor permeability as measured at 40° C. and 90%RH of 500 g/m$^2$·24 h or less are obtainable by adjusting the weight ratio of resin components:filler components to 13:87. With a weight ratio of resin components:filler components of 5:95 or 19:81, the paste compositions are not applicable for the production of semiconductor devices having both reflow resistance and moisture resistance reliability because they forms coating films having void contents of less than 3% by volume or water vapor permeabilities of more than 500 g/m$^2$·24 h.

The protective film of this invention is formed by applying by a known method, such as dispensing or screen printing, the paste composition of this invention to surfaces of semiconductor parts and drying, and the semiconductor parts to be coated may be any semiconductor parts for semiconductor devices. Examples of them are chips in BGA, CSP or TCP, which are mounted on chip-supporting boards which comprise inner connection parts to which terminals of the chips are connected, outer connection parts for connection with outside of the semiconductor devices, and interconnecting parts connecting the inner connection parts with the outer connection parts. The protective film of this invention has a void content of 3% by volume or more, preferably 3 to 30% by volume, more preferably 5 to 30% by volume based on the whole protective film, and a water vapor permeability as measured at 40° C. and 90%RH of 500 g/m$^2$·24 h or less, preferably 30 to 500 g/m$^2$·24 h.

When the protective films of this invention are formed, the drying conditions are preferably varied properly depending on the kinds of the organic solvents used in paste compositions. For example, it is preferable to apply the paste compositions to the surfaces of semiconductor parts and then dried by heating at 50–100° C. for 0.5 to 2 hours, at 101 to 140° C. for 0.5 to 2 hours and at 141 to 180° C. for 0.5 to 2 hours, in this sequence. For example, in cases where paste compositions containing a mixture of polyamide-silicone copolymer:alicyclic epoxy resin of 8:2 (weight ratio) as resin components, a mixture of silicon dioxide powder:silicone rubber powder of 9:1 (weight ratio) as filler components and diethyleneglycol dimethyl ether as the organic solvent are dried by step drying of 70° C.-1 hour/ 120° C.-1 hour/160° C.-1 hour, protective films having void contents and water vapor permeabilities both within the above-described ranges and good properties can be formed. Drying only at 160° C. may give blistered protective films, failing to give protective films with good properties.

The semiconductor devices of this invention have the protective films of this invention as the protective films for the semiconductor parts in the semiconductor devices. For example, the protective films are sealing materials which seal the chips in the semiconductor devices.

In the semiconductor devices of this invention, voids of 1 to 20 μm diameter in the sealing material have a total volume of 1 to 100% by volume of a total volume of voids of 0.0032 to 100 μm diameter in the sealing material, preferably 10 to 100% by volume, more preferably 20 to 100% by volume, further preferably 30 to 100% by volume. If the voids of 1 to 20 μm diameter have a total volume of less than 1% by volume of the total volume of voids of 0.0032 to 100 μm diameter in the sealing material, the packages (sealing materials) may tend to crack for the lack of paths for discharging and relieving the vaporized water generating therein on mounting with heat. Voids of more than 50 μm diameter preferably have a total volume of 30% by volume or less of the total volume of voids of 0.0032 to 100 μm diameter. If the voids of more than 50 μm diameter have a total volume of more than 30% by volume of the total volume of voids of 0.0032 to 100 μm diameter, the paths for discharging and relieving the water vaporized on mounting with heat may be sufficient, but water may be readily absorbed in the packages (sealing materials), lowering the moisture resistance reliability of the packages.

In an example of the structures of the semiconductor devices of this invention, the above-described chip is mounted on a chip-supporting board, which comprises inner connection parts to which terminals of the chip are connected, an outer connection parts for connection with outside of the semiconductor device, and interconnecting parts connecting the inner connection parts with the outer connection parts. In a preferred structure, the inner connection parts are interconnecting patterns formed on one side of an insulating base material, the outer connection parts comprise a plurality of electrode parts formed on the other side of the insulating base material and connected to the interconnecting patterns by the interconnecting parts, the chip is bonded to the side of the insulating base material bearing the interconnecting patterns with an adhesive for bonding semiconductor element, and the terminals of the chip and the interconnecting patterns are connected to each other by gold wires.

The packages of the semiconductor devices may be of any structures wherein semiconductor elements are wholly or partially sealed with the above-described sealing materials, and preferred examples are (1) BGA packages, (2) CSP (Chip Size Package) and (3) TCP (Tape-Carrier Package).

Hereinafter, this invention will be described referring to Examples, which however do not limit the scope of this invention.

The polyamide-silicone copolymer (trade name: HIMAL, produced by Hitachi Chemical Company, Ltd.) used in Examples and Comparative Examples is a thermoplastic resin having a weight average molecular weight of 60000, which was prepared by polycondensing isophthalic chloride as an aromatic dicarboxylic acid component with diamines comprising an aromatic diamine [2,2-bis (diaminophenoxyphenyl)propane] of general formula (I) ($R_1$, $R_2$, $R_3$, $R_4$=H, X=—C(CH$_3$)$_2$—)and a diamine of general formula (II) ($Y_1$=—C$_3$H$_6$—, $Y_2$=—CH$_3$, m=38) (molar ratio 90:10). The aliphatic epoxy resin (trade name: EHPE 3150, produced by Daicel Chemical Industries, Ltd.) is a 1,2-epoxy-4-(2-oxiranyl)cyclohexane adduct (epoxy equivalent weight: 170–200, $C_{126}H_{194}O_{33}$) of 2,2-bis (hydroxymethyl)-1-butanol. The coupling agent (trade name: PRENACT AL-M, produced by Ajinomoto Co., Inc.) is an aluminate coupling agent. The epoxy curing agent (trade name: AMICURE MY-H, produced by Ajinomoto, Co., Inc.) is an amine adduct latent curing agent.

EXAMPLE 1

A varnish was prepared by dissolving 128 parts by weight of a polyamide-silicone copolymer (trade name: HIMAL, produced by Hitachi Chemical Co., Ltd.) and 32 parts by weight of an alicyclic epoxy resin (trade name: EHPE 3150, produced by Daicel Chemical Industries, Ltd.) in 250 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 100 parts by weight of a powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 8 parts by weight of an epoxy curing agent (trade name: AMICURE MY-H, produced by Ajinomoto Co., Inc.), and kneading with three rolls was carried out to prepare a paste composition.

EXAMPLE 2

A varnish was prepared by dissolving 144 parts by weight of a polyamide-silicone copolymer (trade name: HIMAL, produced by Hitachi Chemical Co., Ltd.) and 36 parts by weight of an alicyclic epoxy resin (trade name: EHPE 3150, produced by Daicel Chemical Industries, Ltd.) in 250 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 100 parts by weight of a powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 8 parts by weight of an epoxy curing agent (trade name: AMICURE MY-H, produced by Ajinomoto Co., Inc.), and kneading with three rolls was carried out to prepare a paste composition.

Comparative Example 1

A varnish was prepared by dissolving 40 parts by weight of a polyamide-silicone copolymer (trade name: HIMAL, produced by Hitachi Chemical Co., Ltd.) and 10 parts by weight of an alicyclic epoxy resin (trade name: EHPE 3150, produced by Daicel Chemical Industries, Ltd.) in 150 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 100 parts by weight of a powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 8 parts by weight of an epoxy curing agent (trade name: AMICURE MY-H, produced by Ajinomoto Co., Inc.), and kneading with three rolls was carried out to prepare a paste composition.

Comparative Example 2

A varnish was prepared by dissolving 188 parts by weight of a polyamide-silicone copolymer (trade name: HIMAL, produced by Hitachi Chemical Co., Ltd.) and 62 parts by weight of an alicyclic epoxy resin (trade name: EHPE 3150, produced by Daicel Chemical Industries, Ltd.) in 375 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 100 parts by weight of a powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 8 parts by weight of an epoxy curing agent (trade name: AMICURE MY-H, produced by Ajinomoto Co., Inc.), and kneading with three rolls was carried out to prepare a paste composition.

The paste compositions of Examples 1 and 2 and Comparative Examples 1 and 2 were each applied to a Teflon plate and then dried and cured in an oven at 70° C. for one hour, at 120° C. for one hour and at 160° C. for one hour by elevating the temperature stepwise, to give cured coating films of about 0.5 mm thick. The voids contents of the coating films were obtained by measuring specific gravities.

That is, the theoretical specific gravities "b" of the whole components of the paste compositions except for the organic solvent were calculated from their respective specific gravities "a", the specific gravities of the coating films were determined, and then the void contents were obtained from the equation, Void Content=(1−a/b)×100. The water vapor permeabilities of the coating films were obtained according to JIS Z 0208 (temperature and humidity condition B, namely temperature: 40° C., relative humidity: 90%RH). The results are listed in Table 1.

Figure 1:
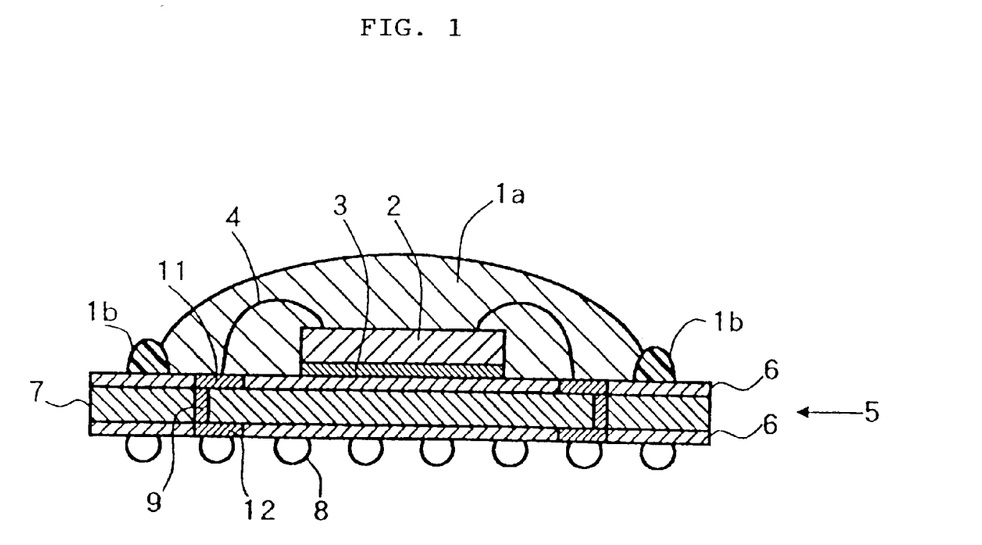
FIG. 1 is a sectional view of a semiconductor device of an embodiment according to this invention.

Subsequently, semiconductor devices as shown in FIG. 1 were produced, to determine reflow resistance and moisture resistance. First, there were prepared chip-supporting boards 5 (trade name: E-679K, produced by Hitachi Chemical Co., Ltd.) of 24 mm×24 mm×0.56 mm thick, wherein gold-plated terminals 11 and interconnecting patterns (not shown) are formed on one side of insulating base material 7 and connected through interconnecting parts 9 with a plurality of electrode parts 12 which are formed on the other side of insulating base material 7 for external connection. Their surfaces, except gold-plated terminals 11 and electrode parts 12, were coated with an about 20 μm thick insulating protective resist (trade name: PSR 4000 AUS 5, produced by Taiyo Ink Kabushiki Kaisha). About 8 mg of adhesive for semiconductor element 2 (trade name: EN-4500, produced by Hitachi Chemical Co., Ltd.) was applied to each chip-supporting board 5 so that it coated an area identical with the shape of a semiconductor element, and dummy semiconductor element 2 that is an Al-patterned chip of 9 mm×9 mm×0.48 mm thick was mounted thereon. Chip-supporting boards 5 mounted with semiconductor elements 2 were placed in an oven to cure adhesive 3, and then semiconductor elements 2 and gold-plated terminals 11 of chip-supporting boards 5 were wire-bonded with gold wires of 30 μm diameter. Dam 1b (trade name: HIR-2500, produced by Hitachi Chemical Co., Ltd.) was formed to dam up paste compositions and prevent outflow from the boards. On the mounting faces of chip-supporting boards 5 mounted with semiconductor elements 2 were potted 0.8 g portions of the paste compositions of Examples 1 and 2 and Comparative Examples 1 and 2, respectively, so that semiconductor elements 2 and gold wires 4 were completely covered. Chip-supporting boards 5 on which semiconductor elements 2 had been mounted and paste compositions had been potted were placed in an oven, and heated at 70° C. for one hour, at 120° C. for one hour and at 160° C. for one hour by elevating temperature stepwise, to dry and solidify the paste compositions. Thus semiconductor devices packaged with cured sealing materials 1a were obtained. When these semiconductor devices are mounted, solder balls 8 are attached.

To examine reflow resistance, the semiconductor devices were allowed to stand in a thermohygrostat (85° C./60%RH) for 168 hours, and then passed through an IR reflow apparatus set to heat their surfaces to 240° C. for 10 seconds, and examined for crack and peeling (the number of reflow: 1). The results are listed in Table 1.

To examine moisture resistance, the semiconductor devices were allowed to stand in a thermohygrostat (85° C./85%RH) while prescribed terminals of the semiconductor devices were applied with a voltage of 10V, to measure the time required for the breaking of the aluminum patterns on semiconductor elements 2 and the insulation failure between the aluminum wirings. The results are listed in Table 1.

TABLE 1

| Measurement items | Unit | Example 1 | Example 2 | Comp. Example 1 | Comp. Example 2 |
|---|---|---|---|---|---|
| Void content | % by volume | 9 | 7 | 35 | 2 |
| Water vapor permeability | g/m$^2$ · 24 h | 83 | 67 | 1000 | 31 |
| Reflow resistance[1] | the number of boards | 0/4 | 0/4 | 0/4 | 4/4 |
| Moisture resistance | h | ≧1000 | ≧1000 | 250 | ≧1000 |

[1](the number of boards wherein crack and peeling occurred)/(the number of examined boards)

Paste Composition A

A varnish was prepared by dissolving 128 parts by weight of a polyamide-silicone copolymer (trade name: HIMAL, produced by Hitachi Chemical Co., Ltd.) and 32 parts by weight of an alicyclic epoxy resin (trade name: EHPE 3150, produced by Daicel Chemical Industries, Ltd.) in 280 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 110 parts by weight of a fine powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 6 parts by weight of an epoxy curing agent (trade name: AMICURE MY-H, produced by Ajinomoto Co., Inc.), and kneading with three rolls was carried out to prepare a paste composition.

Paste Composition B

A varnish was prepared by dissolving 40 parts by weight of a polyamide-silicone copolymer (trade name: HIMAL, produced by Hitachi Chemical Co., Ltd.) and 10 parts by weight of an alicyclic epoxy resin (trade name: EHPE 3150, produced by Daicel Chemical Industries, Ltd.) in 90 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 110 parts by weight of a fine powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 2 parts by weight of an epoxy curing agent (trade name: AMICURE MY-H, produced by Ajinomoto Co., Inc.), and kneading with three rolls was carried out to prepare a paste composition.

Paste Composition C

A varnish was prepared by dissolving 320 parts by weight of a polyamide-silicone copolymer (trade name: HIMAL, produced by Hitachi Chemical Co., Ltd.) and 80 parts by weight of an alicyclic epoxy resin (trade name: EHPE 3150, produced by Daicel Chemical Industries, Ltd.) in 710 parts by weight of diethyleneglycol dimethyl ether. Thereto was added 970 parts by weight of a spherical silicon dioxide powder of 30 μm average particle diameter (trade name: FB-74, produced by Denki Kagaku Kogyo K.K.), and then added were 110 parts by weight of a fine powder of an elastic silicone rubber of 15 μm average particle diameter (trade name: KMP-598, produced by Shin-Etsu Chemical Co., Ltd.), 1 part by weight of a coupling agent (trade name: PRENACT AL-M, produced by Ajinomoto Co, Inc.) and 16 parts by weight of an epoxy curing agent (trade name: AMICURE MY-H, produced by Ajinomoto Co., Inc.), and kneading with three rolls was carried out to prepare a paste composition.

Paste Composition D 160 parts by weight in total of a biphenyl type epoxy resin and a phenol novolak resin as a curing agent and 970 parts by weight of spherical silicon dioxide powder of 30 µm average particle diameter (trade name: FB-74, produced by Denki Kagaku Kogyo K.K.) were mixed and kneaded with three rolls to prepare a paste composition.

Paste Composition E: silicone 160 parts by weight of a silicone resin and 970 parts by weight of spherical silicon dioxide powder of 30 µm average particle diameter (trade name: FB-74, produced by Denki Kagaku Kogyo K.K.) were mixed and kneaded with three rolls to prepare a paste composition.

Paste Composition F 160 parts by weight of a resol phenolic resin and 970 parts by weight of spherical silicon dioxide powder of 30 µm average particle diameter (trade name: FB-74, produced by Denki Kagaku Kogyo K.K.) were mixed, and diluted with 160 parts by weight of methyl ethyl ketone to prepare a paste composition.

The void diameters and void distributions in the coating films of the paste compositions were determined by mercury-porosimetry. That is, after each paste composition was applied in proper quantity to a Teflon sheet, the paste compositions A, B and C were dried with heat at 70° C. for one hour, at 120° C. for one hour and at 160° C. for one hour by elevating temperature stepwise, the paste compositions D and E were dried with heat at 100° C. for 30 minutes and at 150° C. for 3 hours by elevating temperature stepwise, and the paste composition F was dried with heat at 150° C. for 2 hours, to form 0.5 mm thick sheet-like cured coating films. Each coating film was cut into 5 mm×20 mm, and its void distribution within a range of void diameters of 0.0032 to 100 µm was measured with a mercury porosimeter (AUTOSCAN-33 POROSIMETER, produced by QUANTACHROME). From the void distribution, the percentage of the voids of 1 to 20 µm, {(the volume of voids of 1 to 20 µm diameter)/(the volume of voids of 0.0032 to 100 µm diameter)}×100, was calculated. The void contents and water vapor permeability of the thus obtained coating films were determined in the same manner as described above. That is, the theoretical specific gravities "b" of the whole components of the paste compositions except for the organic solvent were calculated from their respective specific gravities "a", the specific gravities of the coating films were determined, and then the void contents were obtained from the equation, Void Content=(1−a/b)×100. The water vapor permeabilities of the coating films were obtained according to JIS Z 0208 (temperature and humidity condition B, namely temperature: 40° C., relative humidity: 90%RH). The results are listed in Table 2.

Semiconductor Device

Chip-supporting boards 5 (trade name: E-679K, produced by Hitachi Chemical Co., Ltd.) of 24 mm×24 mm×0.56 mm thick as shown in FIG. 1 were prepared, wherein gold-plated terminals 11 and interconnecting patterns (not shown) are formed on one side of insulating base material 7 and connected through interconnecting parts 9 with a plurality of electrode parts 12 which are formed on the other side of insulating base material 7 for external connection. Their surfaces, except gold-plated terminals 11 and electrode parts 12, were coated with an about 20 µm thick insulating protective resist (trade name: PSR 4000 AUS 5, produced by Talyo Ink Kabushiki Kaisha). About 8 mg of adhesive for semiconductor element 2 (trade name: EN-4500, produced by Hitachi Chemical Co., Ltd.) was applied to each chip-supporting board 5 so that it coated an area identical with the shape of a semiconductor element, and dummy semiconductor element 2 that is an Al-patterned chip of 9.6 mm×10.2 mm×0.40 mm thick was mounted thereon. Chip-supporting boards 5 mounted with semiconductor elements 2 were placed in an oven to cure adhesive 3, and then semiconductor elements 2 and gold-plated terminals 11 of chip-supporting boards 5 were wire-bonded with gold wires 4 of 30 µm diameter. Dam 1b (trade name: HIR-2500, produced by Hitachi Chemical Co., Ltd.) was formed to dam up paste compositions and prevent outflow from the boards.

EXAMPLE 3

On the mounting faces of chip-supporting boards 5 mounted as described above with semiconductor elements 2 were potted 0.8 g portions of the paste composition A, so that semiconductor elements 2 and gold wires 4 were completely covered. Chip-supporting boards 5 with the potted paste composition were placed in an oven, and heated at 70° C. for one hour, at 120° C. for one hour and at 160° C. for one hour by elevating temperature stepwise, to dry and solidify the paste composition. Thus semiconductor devices packaged with cured sealing materials 1a were obtained.

Comparative Example 3

On the mounting faces of chip-supporting boards 5 mounted as described above with semiconductor elements 2 were potted 0.8 g portions of the paste composition B, so that semiconductor elements 2 and gold wires 4 were completely covered. Chip-supporting boards 5 with the potted paste composition were placed in an oven, and heated at 70° C. for one hour, at 120° C. for one hour and at 160° C. for one hour by elevating temperature stepwise, to dry and solidify the paste composition. Thus semiconductor devices packaged with cured sealing materials 1a were obtained.

Comparative Example 4

On the mounting faces of chip-supporting boards 5 mounted as described above with semiconductor elements 2 were potted 0.8 g portions of the paste composition C, so that semiconductor elements 2 and gold wires 4 were completely covered. Chip-supporting boards 5 with the potted paste composition were placed in an oven, and heated at 70° C. for one hour, at 120° C. for one hour and at 160° C. for one hour by elevating temperature stepwise, to dry and solidify the paste composition. Thus semiconductor devices packaged with cured sealing materials 1a were obtained.

Comparative Example 5

On the mounting faces of chip-supporting boards 5 mounted as described above with semiconductor elements 2 were potted 0.8 g portions of the paste composition D, so that semiconductor elements 2 and gold wires 4 were completely covered. Chip-supporting boards 5 with the potted paste composition were placed in an oven, and heated at 100° C. for 30 minutes and at 150° C. for 3 hours by elevating temperature stepwise, to dry and solidify the paste composition. Thus semiconductor devices packaged with cured sealing materials 1a were obtained.

Comparative Example 6

On the mounting faces of chip-supporting boards 5 mounted as described above with semiconductor elements 2 were potted 0.8 g portions of the paste composition E, so that semiconductor elements 2 and gold wires 4 were completely covered. Chip-supporting boards 5 with the potted paste composition were placed in an oven, and heated at 100° C. for 30 minutes and at 150° C. for 3 hours by elevating temperature stepwise, to dry and solidify the paste composition. Thus semiconductor devices packaged with cured sealing materials 1a were obtained.

Comparative Example 7

On the mounting faces of chip-supporting boards 5 mounted as described above with semiconductor elements 2 were potted 0.8 g portions of the paste composition F so that semiconductor elements 2 and gold wires 4 were completely covered. Chip-supporting boards 5 with the potted paste composition were placed in an oven, and heated at 150° C. for 2 hours to dry and solidify the paste composition. Thus semiconductor devices packaged with cured sealing materials 1a were obtained.

To examine reflow resistance, the semiconductor devices obtained above were moistened by allowing them to stand in an atmosphere of a temperature of 85° C. and a relative humidity of 60%RH for 168 hours, and then passed through an IR reflow apparatus set to heat their surfaces to 240° C. for 10 seconds, and examined for crack and peeling (reflow resistance test).

To examine moisture resistance reliability, the semiconductor devices were allowed to stand in a pressure cooker at 121° C. and under a saturated water vapor pressure of 2 atm, and were then examined for damaged Al wirings at prescribed intervals, to determine the package lifetime required for the percentage of damage to reach 50% (PCT test). The results are listed in Table 2.

TABLE 2

| Items | Ex. 3 | Com. Ex. 3 | Com. Ex. 4 | Com. Ex. 5 | Com. Ex. 6 | Com. Ex. 7 |
|---|---|---|---|---|---|---|
| Paste composition | A | B | C | D | E | F |
| Content of filler (wt %)[1] | 86.6 | 95.3 | 72.1 | 85.8 | 85.8 | 85.8 |
| Vol % of voids of 1 to 20 μm diameter | 80 | 90 | 5 | 0.1 | 0.1 | 5 |
| Water vapor permeability (g/m$^2$ · 24 h) | 83 | 1000 | 36 | 30 | 10000 | 20000 |
| Reflow resistance 85° C./ 60% RH/168 h | 0/4 | 0/4 | 4/4 | 4/4 | 4/4 | 0/4 |
| PCT resistance (h) | 600 | 500 | 600 | 200 | 50 | 50 |
| Void content (vol %) | 9 | 35 | ≦1 | ≦1 | ≦1 | 30 |

[1]The % by weight of the total of silicon dioxide powder and elastic silicone rubber contained in sealing material 1a (calculated value).

INDUSTRIAL APPLICABILITY

Semiconductor devices having good reflow resistance and moisture resistance reliability are obtainable by applying and drying the paste compositions of this invention to form protective films or sealing materials. That is, semiconductor devices sealed by applying and drying the paste compositions of this invention are sealed with sealing materials which contain voids and have properly adjusted water vapor permeabilities. This ensures paths for readily discharging and relieving the water contents vaporized in packages during reflow, endowing the semiconductor devices with excellent reflow resistance. Excellent moisture resistance is also attained because a layer with lower water vapor permeability and higher resin density is formed on and near the surface of the sealing materials and on and near the active faces of semiconductor elements. In addition, the semiconductor devices of this invention are also advantageous in cost because they can be produced by using existing apparatuses for semiconductor packaging without requiring additional steps.

What is claimed is:

1. A paste composition, comprising as essential ingredients (a) 100 parts by weight of a thermoplastic resin, (B) 5 to 150 parts by weight of an epoxy resin, (C) 0.1 to 30 parts by weight of a coupling agent, (D) 100 to 3500 parts by weight of a powdery inorganic filler, (E) 20 to 300 parts by weight of a powder having rubber elasticity and (F) 150 to 3500 parts by weight of an organic solvent and which, when applied and dried, gives a coating film having a void content of 3% by volume or higher and a water vapor permeability as measured at 40° C. and 90%RH of 500 g/m$^2$·24 h or less.

2. The paste composition of claim 1, which, when applied and dried by heating in sequence at 70° C. for 1 hour, at 120° C. for 1 hour and at 160° C. for 1 hour, gives a coating film having a void content of 3% by volume or higher and a water vapor permeability as measured at 40° C. and 90%RH of 500 g/m$^2$·24 h or less.

3. The paste composition of claim 1, which further contains a curing agent (G) for the epoxy resin (B).

4. The paste composition of claim 1, wherein the thermoplastic resin (A) is a polyamide-silicone copolymer or a polyamideimide-silicone copolymer, which is obtainable by polycondensing an aromatic dicarboxylic acid, an aromatic-tricarboxylic acid or a reactive acid derivative thereof with a diamine containing as an essential ingredient a diaminosilicone.

5. The paste composition of claim 1, wherein the epoxy resin (B) is an alicyclic epoxy resin.

6. The paste composition of claim 1, wherein the coupling agent (C) is one or more coupling agents selected from a silane coupling agent, a titanate coupling agent and an aluminate coupling agent.

7. The paste composition of claim 1, wherein the powdery inorganic filler (D) is silicon dioxide powder.

8. The paste composition of claim 1, wherein the powder (E) having rubber elasticity is silicone rubber powder.

9. The paste composition of claim 1, which further contains 1 to 100 parts by weight of a curing agent (G) for the epoxy resin (B) per 100 parts by weight of the epoxy resin (B).

10. The paste composition of claim 1, wherein the weight ratio of a total of the thermoplastic resin (A) and the epoxy resin (B) to a total of the powdery inorganic filler(D) and the powder (E) having rubber elasticity, [(A)+(B)]:[(D)+(E)], ranges from 5:95 to 18:82.

11. A protective film, which is formed by applying the paste composition of claim 1 to a surface of a semiconductor part and drying it and has a void content of 3% by volume or higher and a water vapor permeability as measured at 40° C. and 90%RH of 500 g/m$^2$·24 h or less.

12. The protective film of claim 11, which is formed by applying the paste composition to a surface of a semiconductor part and drying it by heating in sequence at 50 to 100° C. for 0.5 to 2 hours, at 101 to 140° C. for 0.5 to 2 hours and at 141 to 180° C. for 0.5 to 2 hours.

13. The protective film of claim 11, which has a void content of 3 to 30% by volume and a water vapor permeability as measured at 40° C. and 90%RH of 30 to 500 g/m$^2$·24 h.

14. A semiconductor device having the protective film of claim 11.

15. The semiconductor device of claim 14, wherein the protective film is a sealing material sealing a chip in the semiconductor device.

16. The semiconductor device of claim 15, wherein voids of 1 to 20 μm diameter in the sealing material have a total volume of 1 to 100% by volume of a total volume of voids of 0.0032 to 100 μm diameter in the sealing material.

17. The semiconductor device of claim 15, wherein the chip is mounted on a chip supporting board which comprises an inner connection part to which a terminal of the chip is connected, an outer connection part for connection with outside of the semiconductor devices and a interconnecting part connecting the inner connection part with the outer connection part.

18. The semiconductor device of claim 16, wherein the sealing material has a void content of 3 to 30% by volume and a water vapor permeability as measured at 40° C. and 90%RH of 30 to 500 g/m$^2$·24 h.

19. The semiconductor device of claim 17, wherein the inner connection part is a interconnecting pattern formed on one side of an insulating base material, the outer connection part comprises a plurality of electrode parts formed on the other side of the insulating base material and connected to the interconnecting pattern by the interconnecting part, the chip is bonded to the side of the insulating base material bearing the interconnecting pattern by an adhesive for bonding semiconductor element, and the terminal of the chip and the interconnecting pattern are connected to each other by a gold wire.

* * * * *